United States Patent [19]

Khadder et al.

[11] Patent Number: 4,588,454

[45] Date of Patent: May 13, 1986

[54] DIFFUSION OF DOPANT INTO A SEMICONDUCTOR WAFER

[75] Inventors: Wadie N. Khadder; Jia-Tarng Wang, both of Sunnyvale, Calif.

[73] Assignee: Linear Technology Corporation, Milpitas, Calif.

[21] Appl. No.: 684,758

[22] Filed: Dec. 21, 1984

[51] Int. Cl.$^4$ .......................................... H01L 21/385
[52] U.S. Cl. .................... 148/188; 148/186; 148/190
[58] Field of Search ............... 148/188, 186, 189, 190

[56] References Cited

U.S. PATENT DOCUMENTS

| | | | |
|---|---|---|---|
| 3,441,454 | 4/1969 | Shaikh | 148/188 |
| 3,477,887 | 11/1969 | Ehlenberger | 148/188 X |
| 3,528,168 | 9/1970 | Adamic | 148/188 X |
| 3,542,609 | 11/1970 | Bohne et al. | 148/188 |
| 3,707,410 | 12/1972 | Tauchi et al. | 148/187 |
| 3,966,515 | 6/1976 | Guthrie | 148/188 |
| 4,249,970 | 2/1981 | Briska et al. | 148/188 |
| 4,313,773 | 2/1982 | Briska et al. | 148/188 |
| 4,514,440 | 4/1985 | Justice et al. | 148/188 X |

OTHER PUBLICATIONS

Ghandhi, *VLSI Fabrication Principles*, John Wiley & Sons, N.Y. 1983, pp. 398 and 399.
Periodic Table of the Elements, Sargent-Welch Scientific Co., Skokie, Ill.

*Primary Examiner*—George T. Ozaki
*Attorney, Agent, or Firm*—Flehr, Hohbach, Test, Albritton & Herbert

[57] ABSTRACT

A process for doping a semiconductor material is performed during a deposition phase in a plurality of steps, first at a relatively low temperature to form a high concentration glass formation layer of the dopant on a semiconductor wafer at a high rate, and then raising the temperature slowly to provide an initial drive-in of the dopant. After etch removal of excess glass formation, the wafers are subjected to a base diffusion at an elevated temperature in an oxidizing atmosphere.

6 Claims, No Drawings

DIFFUSION OF DOPANT INTO A SEMICONDUCTOR WAFER

TECHNICAL FIELD

This invention relates to a process of doping a semiconductor, and in particular to an improved process for diffusing boron into a silicon wafer.

BACKGROUND ART

In prior art processes for diffusing boron into a silicon wafer, the steps of deposition of a boron glass formation and the diffusion of the boron into the silicon lattice are accomplished at a single temperature, such as 1,000° Centigrade, for example. It has been found that this conventional approach is difficult to control because the resultant sheet resistance is dependent on the simultaneous uniformity of temperature, gas mixing, reaction rate, and interaction with the wafers. In order to achieve the desired uniformity, the conventional deposition process which utilizes a boron chloride gas supply, employs widely spaced wafers disposed in a furnace tube so that load sizes and thus process capacity are limited.

SUMMARY OF THE INVENTION

An object of this invention is to provide an improved process for doping a silicon wafer with boron to form a P-N junction. In accordance with this invention, a boron glass formation layer is formed on the surface of a silicon wafer at a relatively low temperature. The thickness and concentration of the glass layer is in excess of the amount conventionally required to enable doping of the silicon to the desired junction depth. The temperature is then ramped up to a level at which boron is diffused from the glass into the wafer. The amount of dopant is controlled only by time and temperature in this step and not on the amount of boron (which is chosen to be excessive for this purpose).

DESCRIPTION OF THE PREFERRED EMBODIMENT

In keeping with this invention, a plurality of silicon wafers, about 0.020 inches thick, are disposed in a heating chamber or furnace in an environment of boron trichloride, nitrogen, hydrogen, and oxygen. The wafers are positioned serially in rows and orthogonally relative to the gas flow direction, with the wafer surfaces parallel to each other. The deposition process is accomplished in two phases or two steps, which are integrated into one furnace cycle. Although the wafers are stacked vertically in a formation parallel to each other, there is sufficient turbulence of the gases to deposit the desired amount of boron oxide glass on each wafer.

In the deposition phase of the process, the temperature is raised to a level in the range of 800°–1000° Centigrade, preferably about 950° Centigrade. At this temperature, the solid solubility and diffusivity of the boron is relatively low, for example, respectively about $1.5 \times 10^{20}/cm^3$, and about 0.05 micrometers/$\sqrt{hour}$ At the same time, the boron oxide glass formation rate is very high, especially in the presence of water vapor which is formed in the presence of the hydrogen and oxygen gases, whereby the boron chloride is decomposed and boron oxide glass is formed. The water vapor acts to speed up the glass formation process, so that a large quantity of boron-rich glass is deposited on the silicon wafers in a relatively short period of time. During this phase, very little boron is incorporated into the silicon.

The concentration of boron in the boron-rich glass; is greater than the amount necessary to achieve the desired doping of the wafers. With this process, the uniformity of the various parameters, such as temperature, gas mixture, reaction rate, and wafer interaction are not significant and need not be critically controlled.

Subsequent to this deposition step during which an ample boron glass layer, of about 1,000 Angstroms for the 40 ohms per square process for example, is deposited, the temperature is slowly ramped up over a period of about ten minutes to about 1,025° Centigrade in this embodiment. This temperature is maintained for 25 minutes, during which boron dopant is driven out of the boron oxide glass and incorporated into the silicon wafer. As long as there is an ample quantity of boron glass on the surface, the rate of drive-in incorporation is dependent only upon the temperature, and not on the available amount of boron oxide, as occurs in conventional doping processes. Thus, as long as there is a sufficient amount of boron in the glass layer, even if excessive, the incorporation at the higher temperature occurs more uniformly than experienced with prior art diffusion processes.

After the incorporation or coalescence of the boron dopants into the semi-conductor wafers, in a single integrated furnace cycle as described above, the wafers are removed, and remaining boron oxide glass is etched off in a 10:1 (dilute) HF solution. Selected test wafers are then measured electrically with a four-point probe measuring system to determine the sheet resistance. The depth of the shallow junction is about 0.5 $\mu m$ (micrometers) deep at this point. The wafers are then subjected to other conventional processes as required, e.g., drive-in diffusion.

As a result of the process set forth herein, decided improvements in productivity and uniformity control were noted. A comparison of performance for prior art processes and the process disclosed herein is presented in the following table:

|  | Prior Art Process | Disclosed Process |
| --- | --- | --- |
| Range of $R_s$ (ohms/square) | 4–40 | 4–90+ |
| 4" Wafer Load Size/Cycle in a 30" Flat Zone | 25 | 100 |
| Variation in $R_s$ (Per Wafer) | ±10% | ±3% |
| Variation in $R_s$ (Across the Load) | ±15% | ±5% |

It should be understood that the invention is not limited to the particular materials or parameters specified above, but that modifications may be made well within the scope of the invention. Also it is contemplated that the invention may be applicable to dopants of other Group III elements and Group V elements, and to other semiconductor wafer materials.

What is claimed is:

1. A method for doping silicon wafers with a dopant selected from the group consisting of boron, phosphorus, arsenic and antimony comprising:
    a deposition phase comprising the step of depositing a layer consisting essentially of a large quantity of glass formation of a selected dopant on said silicon wafers at a first temperature within a defined temperature range, so that said large quantity of glass formation is formed on said wafers at a relatively high rate in a short period of time;

an incorporation phase comprising the step of controllably raising said first temperature to a relatively higher temperature and maintaining said higher temperature for a specified period so that a specified amount of dopant is incorporated into said wafers; and etching excess glass formation from said wafers.

2. A method as in claim 1, wherein said environment is a mixture of boron trichloride, nitrogen, hydrogen, and oxygen.

3. A method as in claim 1, wherein the temperature of the first step of the deposition phase of depositing said dopant glass formation is achieved at about 950° Centigrade.

4. A method as in claim 1, wherein the step of etching the excess glass formation is accomplished with an aqueous solution of hydrogen fluoride.

5. A method as in claim 1, wherein said deposition phase provides a diffusion depth of about 0.5 micron in said wafer.

6. A method as in claim 1, wherein the dopant that is selected is boron, and during the deposition phase maintaining the wafers in an environment at a temperature in the range of about 800°–1000° Centigrade, and during the incorporation phase raising the temperature to about 1025° Centigrade over a period of about 10 minutes, and maintaining such temperature for about 25 minutes.

* * * * *